United States Patent [19]
Suzuki

[11] Patent Number: 5,630,271
[45] Date of Patent: May 20, 1997

[54] METHOD OF FORMING A WIRING PATTERN FOR AN ELECTRONIC CIRCUIT ON A GENERAL-PURPOSE CIRCUIT BOARD

[75] Inventor: Kei Suzuki, Tokyo, Japan

[73] Assignee: NEC Corporation, Tokyo, Japan

[21] Appl. No.: 534,994

[22] Filed: Sep. 27, 1995

[30] Foreign Application Priority Data

Sep. 29, 1994 [JP] Japan .................. 6-234647

[51] Int. Cl.$^6$ .................................. H05K 3/02
[52] U.S. Cl. ................ 29/846; 29/850; 174/265
[58] Field of Search ................ 29/837, 850, 525, 29/846; 174/265

[56] References Cited

U.S. PATENT DOCUMENTS

| | | | |
|---|---|---|---|
| 3,114,194 | 12/1963 | Lohs ........................................... | 29/850 |
| 3,253,324 | 5/1966 | Frey et al. ................................. | 29/837 |
| 3,887,904 | 6/1975 | Krag ........................................ | 29/850 X |
| 4,460,024 | 7/1984 | Erhardt .................................... | 29/525 X |
| 4,646,436 | 3/1987 | Crowell et al. .......................... | 29/850 |
| 4,908,939 | 3/1990 | Shieber et al. .......................... | 29/850 |

Primary Examiner—Carl J. Arbes
Attorney, Agent, or Firm—Sughrue, Mion, Zinn, Macpeak & Seas

[57] ABSTRACT

A unique general-purpose circuit board and a unique burning jig implement a wiring pattern for the trial manufacture of a new electronic circuit. The circuit board is implemented as an insulative plate on which horizontal and vertical parallel conductive lines are provided, and in which through holes are formed at the junctions of the lines. Each through hole is surrounded by four conductive portions insulated from each other and each being connected to a particular conductive line. The burning jig has a flat base and burning pins studded on the base and each corresponding to one of the through holes. Each burning pin has four metal pieces at one end thereof. The four metal pieces are insulated from each other and respectively correspond to the four conductive portions surrounding a single through hole. After the pins of the jig have been inserted into the through holes of the circuit board, the line connecting any nearby through holes is burned off by a current fed to between the metal pieces of the corresponding pins.

1 Claim, 3 Drawing Sheets

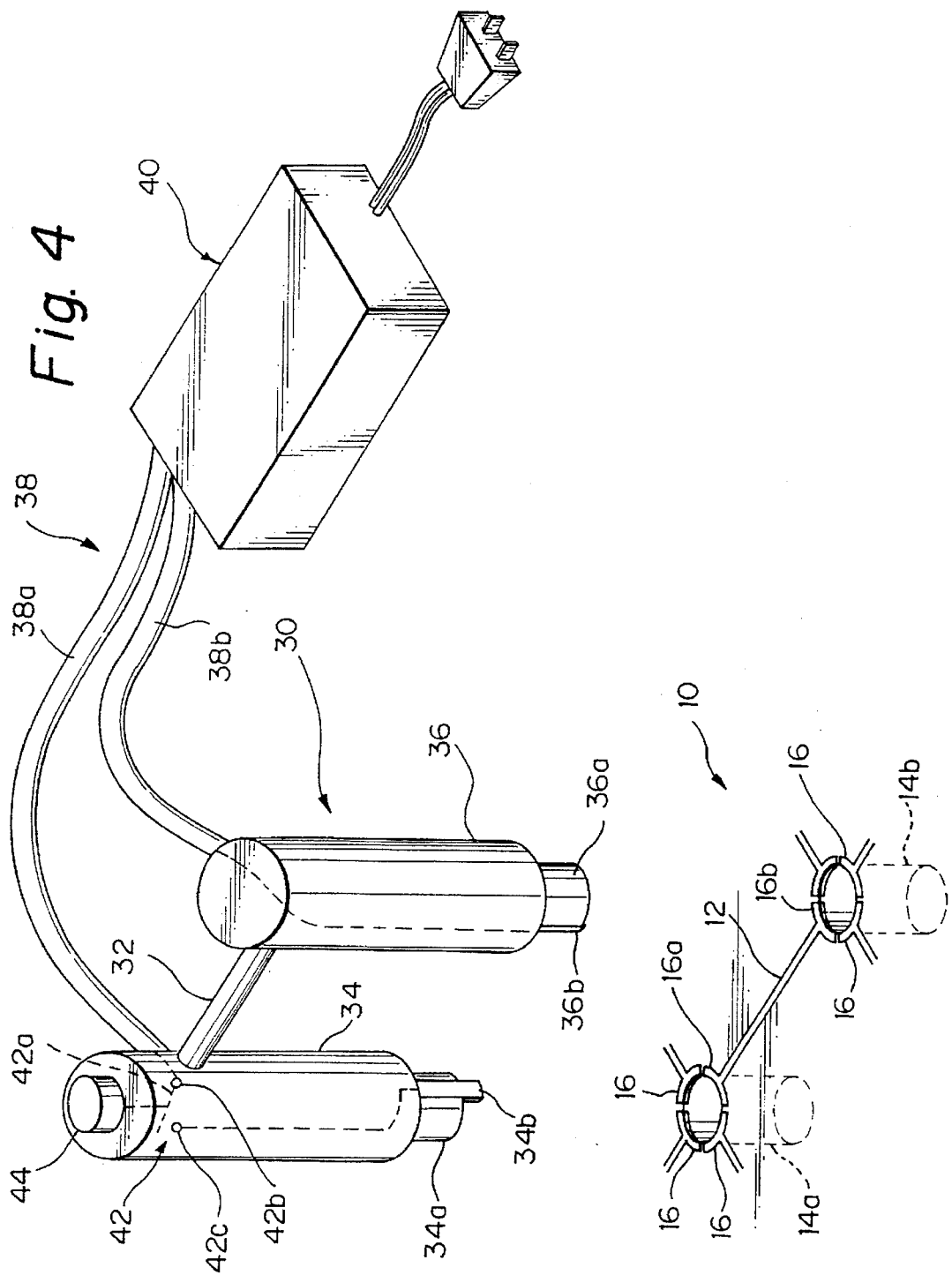

5,630,271

METHOD OF FORMING A WIRING PATTERN FOR AN ELECTRONIC CIRCUIT ON A GENERAL-PURPOSE CIRCUIT BOARD

BACKGROUND OF THE INVENTION

The present invention relates to a general-purpose circuit board for the trial manufacture of a new electronic circuit, and a method of forming a wiring pattern for an electronic circuit thereon.

For the trial manufacture of a new electronic circuit, it has been customary to design a wiring pattern corresponding to the circuit and then fabricate a printed circuit board based on the wiring pattern, or to lay wires on a commercially available general-purpose circuit board by hand in a pattern matching the desired circuit. However, the printed circuit scheme is expensive and time-consuming because the wiring pattern cannot be designed without resorting to expert knowledge and special equipment. On the other hand, the commercially available circuit board scheme which needs manual wiring is apt to result in defective soldering and in noise attributable to the arrangement of wires. These limit quality available with a trial electronic circuit. Moreover, because the manual wiring work consumes a long period of time and makes it difficult to fabricate a number of identical electronic circuits.

SUMMARY OF THE INVENTION

It is, therefore, an object of the present invention to provide a general purpose circuit board which allows a wiring pattern for a desired electronic circuit to be easily and reliably formed thereon without resorting to the design of a new wiring pattern, and a method of forming such a wiring pattern on the same.

A general-purpose circuit board of the present invention has a plate made of an insulating material, a plurality of parallel conductive lines extending on the plate in a vertical and a horizontal direction, through holes formed in the plate at all junctions of the conductive lines, and four conductive portions surrounding each through hole, and respectively connected to four of the conductive lines adjoining the through hole in the horizontal and vertical directions, and insulated from each other.

Also, a method of forming a wiring pattern for an electronic circuit on a general-purpose circuit board of the present invention has three consecutive steps. In a first step, a general-purpose circuit board and a burning jig are provided. The circuit board has a plate made of an insulating material, a plurality of parallel conductive lines extending on the plate in the vertical and horizontal directions, and through holes formed in the plate at all junctions of the conductive lines and each being surrounded by a four conductive portions which are respectively connected to four of the conductive lines adjoining the through hole in the horizontal and vertical directions and are insulated from each other. The burning jig has a flat plate and a plurality of burning pins studded on the flat plate and respectively corresponding in position to all of the through holes. The burning pins each has four metal pieces insulated from each other and respectively corresponding to the four conductive portions. In a second step, all the burning pins are inserted into corresponding ones of the through holes. In a third step, a current is fed to between facing ones of the metal pieces of two of the burning pins which correspond to designated two nearby ones of the through holes to thereby burn off one of the conductive lines connecting the facing conductive portions of the two nearby through holes.

BRIEF DESCRIPTION OF THE DRAWINGS

The above and other objects, features and advantages of the present invention will become more apparent from the following detailed description taken with the accompanying drawings in which:

FIG. 4 is a perspective view of a burning device applicable to the embodiment and capable of burning off a single conductive line at a time

DESCRIPTION OF THE PREFERRED EMBODIMENT

Figure 1:
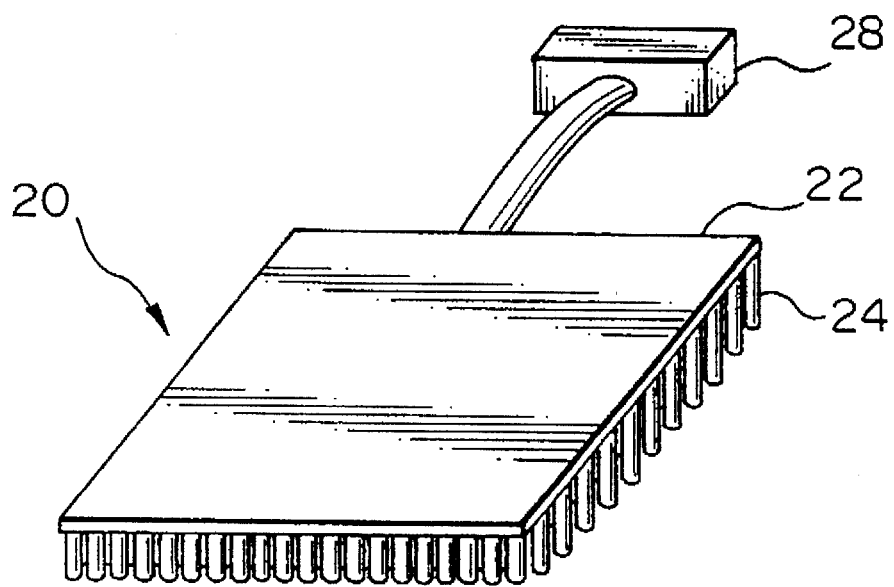
FIG. 1 is an external perspective view of a general-purpose circuit board embodying the present invention, and a specific burning jig for forming an electronic circuit thereon.
Figure 1:
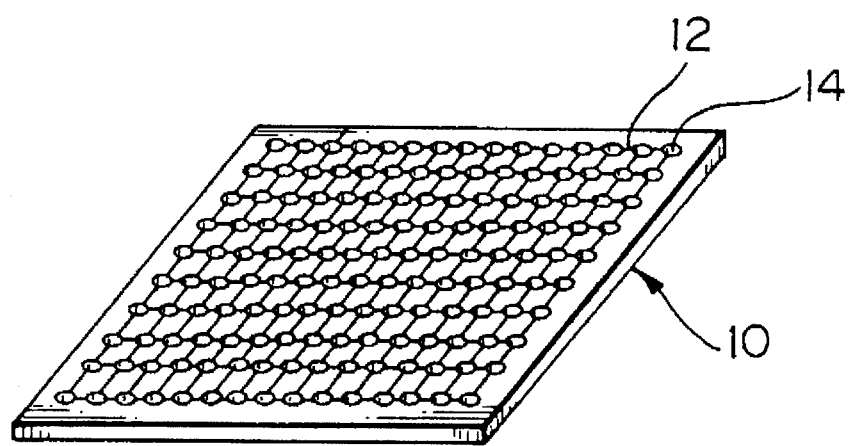

Referring to FIG. 1 of the drawings, there are shown a general-purpose circuit board embodying the present invention, and a specific burning jig for forming a wiring pattern in the circuit board. As shown, the circuit board, generally 10, has a plate made of epoxy glass or similar insulating material. A plurality of conductive lines 12 are provided on the plate in the horizontal and vertical directions, forming a lattice-like wiring pattern 12. Through holes 14 are formed in the plate at all the junctions of the wiring pattern 12.

Figure 2:
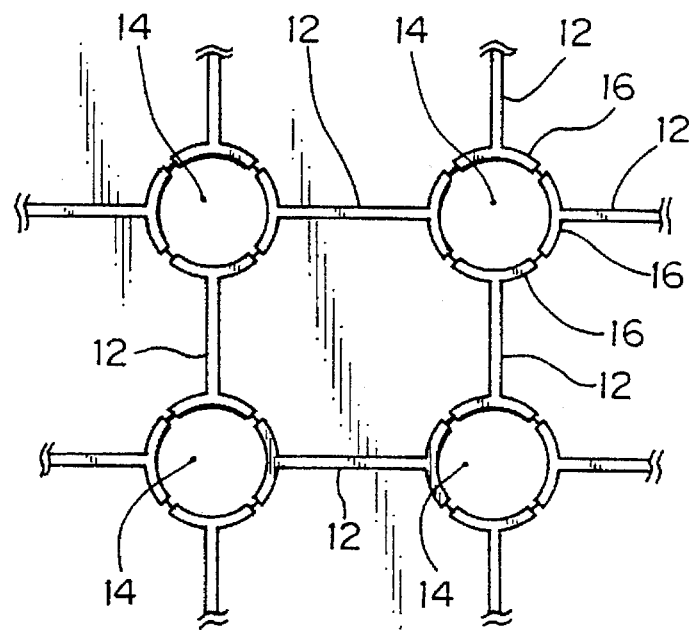
FIG. 2 is a plan view showing a part of the circuit board in detail.

FIG. 2 shows the portions of the circuit board 10 surrounding the through holes 14. As shown, the through holes 14 are so sized and spaced as to allow the pins of a DIP IC (Dual in Line Package Integrated Circuit) to pass therethrough. The through holes 14 are simple holes when seen from the rear of the circuit board 10. However, as shown in FIG. 2, four conductive portions 16 surround each through hole 14 on the front of the circuit board 10, and each is connected to one of the horizontal and vertical lines 12 terminating at the hole 14. It is to be noted that the wiring pattern 12 lacks one or two of the four conductive patterns 16 at its edges in the horizontal and vertical directions. The conductive portions 16 surrounding a single through hole 14 are implemented by copper foil or similar conductive material and extend to the inner periphery of the hole 14. The conductive portions 16 are insulated from each other. When the pins of a DIP IC are inserted into the through holes 14 and soldered or when solder is put on the through holes 14, the conductive portions 16 associated with the same hole 14 are electrically connected to each other and allows the hole 14 to function in the same manner as a conventional through hole. The conductive portions 16 surrounding the through hole 14 are each connected to one of the conductive portions 16 of the adjoining through hole 14 that faces it.

A burning jig 20 shown in FIG. 1 is used to form a wiring pattern matching a trial electronic circuit on the circuit board 10. The jig 20 has a flat base 22, and a number of burning pins 24 studded on the base 22. The number and positions of the pins 24 are substantially identical with the number and positions of the through holes 14 of the circuit board 10.

Figure 3:
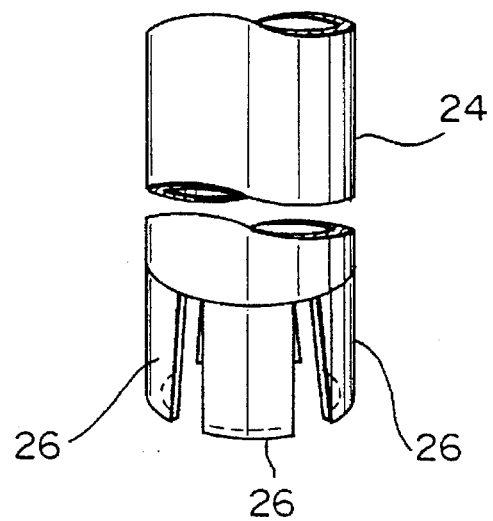
FIG. 3 is a perspective view showing a part of the jig in detail.

As shown in FIG. 3, each pin 24 has four metal pieces 26 respectively corresponding to the four conductive portions 14 of one through hole 14. A particular coordinates number is given to each of the four metal pieces 26. The coordinates number assigned to each pin 24 and the coordinates numbers assigned to the four metal pieces 26 of the pin 24 are respectively identical with the coordinate number of the associated through hole 14 and the coordinate numbers assigned to the four conductive portions 16. Hence, assuming that ten through holes 14 are formed in the circuit board 10, then ten coordinates numbers are each assigned to one of the through holes 14 and corresponding one of the pins 24; forty conductive portions 16 and forty metal pieces 26 exist in total.

The pins 24 are inserted into the through holes 14 with their coordinates numbers matched to the coordinates numbers of the through holes 14. In this condition, when a current is fed via a connector 28 to between two of the four metal pieces 26 corresponding to two of the four conductive members 16 which connect two nearby through holes 14, a great current flows through the line 12 connecting the above two conductive portions 16. As a result, the line 12 is burned off. The current to flow through the line 12 is far greater in size than a current to flow through it during the course of ordinary operation.

In the above configuration, when data representative of a desired wiring pattern are sent from, e.g., a personal computer to the connector 28, only the lines 12 connecting the designated through holes 14 are automatically burned off. As a result, the desired wiring pattern is formed on the circuit board 10, so that a wiring board for producing a trial electronic circuit is achieved. After electronic devices including a DIP IC have been mounted on the wiring board, solder is put on all the through holes 14 to complete the trial electronic circuit.

Referring to FIG. 4, a device capable of burning off the lines 12 between the through holes 14 one by one will be described. As shown, the device has a probe 30 made up of two grips 34 and 36. The grips 34 and 36 are connected to each other by a tie-bar 32 and connected to a power source unit 40 by a current feed cable 38 having a positive cord 38a and a ground cord 38b. The grips 34 and 36 respectively have cylindrical portions 34a and 36a at their lower ends. The cylindrical portions 34a and 36a are formed of a n insulator and are inserted into the through holes 14, as will be described later. Metal pieces 34b and 36b are respectively affixed to the portions 34a and 36a and positioned to face each other. A switch 42 is disposed in one grip 34 and has a movable contact 42a. When a switch button 44 provided on the top of the grip 34 is pressed, the movable contact 42a connects stationary contacts 42b and 42c to each other. The stationary contact 42b is connected to the positive cord 38a while the ground cord 38b is connected to the metal piece 36b of the other grip 36. Hence, when the switch button 44 is pressed, the metal piece 34b of the grip 34 is brought into connection with the power source unit 40.

In operation, when the portions 34a and 36a of the grips 34 and 36 are respectively inserted into the through holes 14a and 14b, they respectively contact the arcuate conductive portions 16a and 16b of the nearby through holes 14a and 14b and facing each other. When the switch button 44 is pressed, a current is fed from the power source unit 40 to the probe 30. As a result, a current flows through the line 12 connecting the conductive portions 16a and 16b and burns it off. The current to flow through the line 12 is about 1 ampere to 5 amperes, although it depends on the thickness and material of the line 12. Because the line 12 burns off instantaneously, the button switch 44 may be released in a short period of time.

If desired, a number of probes 30 each having the grips 34 and 36 may be combined and connected to the power source unit 40 together in order to burn off a plurality of lines 12 at a time.

In summary, it will be seen that the present invention allows a wiring pattern for a desired electronic circuit to be easily and reliably formed without resorting to the design of a new wiring pattern. This unprecedented advantage is derived from a unique general-purpose circuit board and a unique burning jig. The circuit board is implemented as an insulative plate on which horizontal and vertical parallel conductive lines are provided, and in which through holes are formed at the junctions of the lines. Each through hole is surrounded by four conductive portions insulated from each other and each being connected to a particular conductive line. The jig has a flat base and burning pins studded on the base and each corresponding to one of the through holes. Each burning pin has four metal pieces at one end thereof. The four metal pieces are insulated from each other and respectively correspond in position to the four conductive portions surrounding a single through hole. After the pins of the jig have been inserted into the through holes of the circuit board, the line connecting any nearby through holes is burned off by a current fed to between the metal pieces of the corresponding pins.

Various modifications will become possible for those skilled in the art after receiving the teachings of the present disclosure without departing from the scope thereof.

What is claimed is:

1. A method of forming a wiring pattern for an electronic circuit on a general-purpose circuit board, comprising the steps of:

(a) providing a general-purpose circuit board and a burning jig, said circuit board comprising a plate made of an insulating material, a plurality of parallel conductive lines extending on said plate in a vertical and a horizontal direction, and through holes formed in said plate at all junctions of said plurality of conductive lines and each being surrounded by a four conductive portions which are respectively connected to four of said plurality of conductive lines adjoining the through hole in the horizontal and vertical directions and are insulated from each other, said burning jig comprising a flat plate and a plurality of burning pins studded on said flat plate and respectively corresponding in position to all of said through holes, said burning pins each comprising four metal pieces insulated from each other and respectively corresponding to said four conductive portions;

(b) inserting all of said burning pins into corresponding ones of said through holes; and feeding a current to between facing ones of said metal pieces of two of said burning pins which correspond to designated two nearby ones of said through holes to thereby burn off one of said conductive lines connecting the facing conductive portions of said two nearby through holes.

* * * * *